(12) United States Patent
Wang et al.

(10) Patent No.: US 11,873,541 B2
(45) Date of Patent: Jan. 16, 2024

(54) METHOD FOR DETERMINING SOURCE SINK TERM IN IONIC TYPE RARE EARTH ORE LEACHING PROCESS

(71) Applicant: JIANGXI UNIVERSITY OF SCIENCE AND TECHNOLOGY, Jiangxi (CN)

(72) Inventors: Guanshi Wang, Jiangxi (CN); Ping Long, Jiangxi (CN); Shili Hu, Jiangxi (CN); Chenliang Peng, Jiangxi (CN); Lei Qin, Jiangxi (CN)

(73) Assignee: JIANGXI UNIVERSITY OF SCIENCE AND TECHNOLOGY, Jiangxi (CN)

( * ) Notice: Subject to any disclaimer, the term of this patent is extended or adjusted under 35 U.S.C. 154(b) by 1090 days.

(21) Appl. No.: 16/691,632

(22) Filed: Nov. 22, 2019

(65) Prior Publication Data

US 2020/0199708 A1 Jun. 25, 2020

(30) Foreign Application Priority Data

Nov. 22, 2018 (CN) .......................... 201811397711.1

(51) Int. Cl.
*C22B 3/14* (2006.01)
*C22B 59/00* (2006.01)
*G06F 30/20* (2020.01)

(52) U.S. Cl.
CPC ................ *C22B 3/14* (2013.01); *C22B 59/00* (2013.01); *G06F 30/20* (2020.01)

(58) Field of Classification Search
CPC ............ C22B 3/14; C22B 59/00; G06F 30/20

USPC ........................................................ 423/21.5
See application file for complete search history.

(56) References Cited

FOREIGN PATENT DOCUMENTS

CN 108319791 7/2018

OTHER PUBLICATIONS

CN 108319791 A, abstract. (Year: 2018).*
CN 107217141 A, abstract. (Year: 2017).*
CN 106939374 A, abstract. (Year: 2017).*
Jian Liu et al., "Impacts of the Concentration of Leaching Lixiviant on rare Earth's Leaching Effect," Science Technology and Engineering, vol. 15, No. 28, Oct. 2015, pp. 133-135.
Shi-Li Hu et al., "An Ion Exchange Model for Leaching Process of Weathered Crust Elution-deposited rare Earth," Mining and Metallurgical Engineering, vol. 38, No. 4, Aug. 2018, pp. 1-5.

* cited by examiner

*Primary Examiner* — Daniel Berns
(74) *Attorney, Agent, or Firm* — JCIP GLOBAL INC.

(57) ABSTRACT

The present disclosure relates to a method for determining a source sink term of an ionic type rare earth ore leaching process. The method includes the following four steps: (1) determining an ion exchange selection coefficient of a rare earth ore sample; (2) determining the rare earth grade of the rare earth ore sample; (3) building a source sink term model of the ore leaching process; and (4) determining parameters in the source sink term model. The present disclosure can simulate the ionic type rare earth ore leaching process by combining a convection-dispersion equation, and determine the optimal concentration of the ore leaching agent. When an ammonium sulfate solution at an optimal concentration of 12.0 g/L is used to perform a column leaching test, the obtained rare earth leaching rate is up to 96.3 percent.

6 Claims, No Drawings

METHOD FOR DETERMINING SOURCE SINK TERM IN IONIC TYPE RARE EARTH ORE LEACHING PROCESS

CROSS-REFERENCE TO RELATED APPLICATION

This application claims the priority benefit of China application serial no. 201811397711.1, filed on Nov. 22, 2018. The entirety of the above-mentioned patent application is hereby incorporated by reference herein and made a part of this specification.

FIELD

The present disclosure relates to the field of in-situ ore leaching, and more particularly relates to a method for determining a source sink term in an ionic type rare earth ore leaching process.

BACKGROUND

Southern ionic type rare earth is rich in medium and heavy rare earth resources, and medium and heavy rare earth plays a vital role in the development of high-end technological products. At the present stage, ammonium sulfate is used as an ore leaching agent, and ionic type rare earth ores are mined by an in-situ leaching. The in-situ leaching is to arrange a liquid injection hole net in a mining area according to a hole spacing of 1.0 to 2.0 m. The unit consumption of the ammonium sulfate is determined according to prospecting data, and an ammonium sulfate solution at a certain concentration is injected into liquid injection holes, so that ammonium ions in the solution exchange with rare earth ions adsorbed on the surfaces of rare earth ore sample particles, and the desorbed rare earth ions flow into a liquid collection process along with the solution. After the ammonium sulfate solution is injected completely, supernatant liquid is injected into the injection holes. After the concentration of the rare earth ions in mother liquid is less than 0.01 g/L, the mining is completed. Main factors affecting the mining of the ionic rare earth ores include arrangement of the liquid injection hole net, the concentration of the ammonium sulfate solution, the amount of the ammonium sulfate and the arrangement of the liquid collection process. The concentration of the ammonium sulfate solution and the amount of the ammonium sulfate are the main factors affecting the rare earth leaching rate.

At present, there are mainly two methods for determining the concentration of the ammonium sulfate solution and the amount of the ammonium sulfate. One method is to determine the concentration of the ammonium sulfate solution and the amount of the ammonium sulfate based on the previous mining experience with reference to the prospecting data. Due to the complexity of geological conditions, each mine has significantly different geological conditions. The concentration of ammonium sulfate determined by experience is often not within a reasonable concentration range. In case of an extremely high concentration, ammonia nitrogen in a surrounding water body will exceed the standard, causing environmental pollution. In case of an extremely low concentration, the rare earth leaching is insufficient, resulting in waste of resources and prolonging the ore leaching period. The other method is to perform on-site sampling for an indoor column leaching test. According to results of the indoor column leaching test, references are provided for the concentration of the ammonium sulfate solution and the amount of the ammonium sulfate for actual mining. Due to the complex geological conditions and non-uniform rare earth grade distribution of an actual mine, it is difficult to accurately simulate the geological conditions and the grade distribution of the actual mine by the indoor column leaching test, so the results of the indoor column leaching test are limited to the guiding significance for accurately determining the concentration of the ammonium sulfate solution and the amount of the ammonium sulfate in the actual ore leaching process.

A suitable mathematical model is created. Water motion parameters, solute transport parameters and distribution information of rare earth grade and the like of the actual mine are acquired through the prospecting data. A value calculation method used to simulate the ore leaching process is a most direct and effective method for determining the concentration of the ammonium sulfate solution and the amount of the ammonium sulfate by fully considering the geological conditions and the rare earth grade distribution of the actual mine. The ionic type rare earth ore leaching process can be divided into a leaching process where the ammonium ions of an external solution exchanges with the rare earth ions adsorbed on the surfaces of the rare earth ore sample particles and a transportation process where the rare earth ions and the ammonium ions flow downwards along with the solution. Therefore, the ionic type rare earth ore leaching process is actually a solute transport process of the ammonium ions and the rare earth ions in ore bodies (the leaching process is a source sink term, and the transport process is mainly affected by convection and dispersion). A scientific study is done on the solute transport process of the ammonium ions and the rare earth ions in the ore bodies, and a corresponding solute transport model is built, and the ore leaching process is simulated, so that the concentration of the ammonium sulfate solution and the amount of the ammonium sulfate are determined scientifically. A large number of studies have been done on the transport process of the ions in the ore bodies, so that mechanisms and models for transportation are relatively mature. There are a few of studies on the leaching process, so that providing a method for determining a source sink term of an ionic type rare earth ore leaching process has an important significance for scientific determination of the concentration of the ammonium sulfate solution and the amount of the ammonium sulfate and green mining of the ionic type rare earth ores.

SUMMARY

The present disclosure is directed to provide a method for determining a source sink term in an ionic type rare earth ore leaching process.

The technical solution of the present disclosure is as follows:

The method for determining the source sink term in the ionic type rare earth ore leaching process includes the following steps:

Step one: determining an ion exchange selection coefficient of a rare earth ore sample:

performing a balance tube leaching test for leaching an ionic type rare earth ore sample by an ore leaching agent at a concentration of 1.0 to 20.0 g/L, testing the concentration of rare earth ions in leachate by using an existing method to obtain a relationship curve of the concentration of the ore leaching agent solution and the concentration of the rare earth ions in the leachate, fitting the relationship curve of the concentration of the ore leaching agent and the concentration of the rare earth ions in the leachate by using an ion exchange model by taking the ion exchange selection coefficient as a basic unknown, and determining the ion exchange selection coefficient of the rare earth ore sample;

Step two: determining the rare earth grade of the rare earth ore sample:

performing a balance tube leaching test by an ammonium sulfate solution at a concentration of 20 g/L according to a liquid-to-solid ratio of 5:1 mL/g, performing solid-liquid separation on the leachate and the rare earth ore sample, measuring off the ammonium sulfate solution at the same volume as that in the tube leaching test to rinse the rare earth ore sample, testing a total mass of leached rare earth ions, and calculating the grade of the rare earth ore sample by the relational expression (1):

$$\eta = \frac{m_{RE} M_{REO}}{m_s M_{RE}}, \quad (1)$$

wherein in the relational expression (1), $\eta$ is the rare earth grade; $m_{RE}$ is the total mass of the leached rare earth ions; $m_s$ is the mass of the rare earth ore sample; and $M_{REO}$ and $M_{RE}$ are respectively the molar masses of a rare earth oxide and the rare earth ions;

Step three: building a source sink term model of the ore leaching process, wherein the rare earth leaching of the ionic type rare earth ore sample includes three processes: (1) ammonium ions reach the surfaces of rare earth ore sample particles through a diffusion layer, (2) the ammonium ions and the rare earth ions adsorbed on the surfaces of the rare earth ore sample particles undergo ion exchange reaction, and (3) the desorbed rare earth ions get into an external solution through the diffusion layer;

the process that the ammonium ions and the rare earth ions pass through the diffusion layer is described by the Fick law, and the ammonium ions and the rare earth ions pass through the diffusion layer may be respectively calculated through a relational expression (2) and a relational expression (3):

$$-\frac{dN_{RE}}{dt} = \frac{1}{3} m_s \frac{C_{lq}^{NH_4} - C_{in}^{NH_4}}{\alpha_{NH_4} M_{NH_4}} \quad (2)$$

$$-\frac{dN_{RE}}{dt} = m_s \frac{C_{in}^{RE} - C_{lq}^{RE}}{\alpha_{RE} M_{RE}}; \quad (3)$$

in the relational expression (2) and the relational expression (3), $N_{RE}$ is the number of moles of the rare earth ions adsorbed on the surfaces of rare earth ore particles; t is time; d is a derivative symbol; $m_s$ is the mass of the rare earth ore sample; $C_{lq}^{NH_4}$ and $C_{lq}^{RE}$ are the concentrations of the ammonium ions and the rare earth ions in the external solution, respectively; $C_{in}^{NH_4}$ and $C_{in}^{RE}$ are the concentrations of the liquid phase ammonium ions and the liquid phase rare earth ions near the surfaces of the rare earth ore sample particles, respectively; $\alpha_{NH_4}$ and $\alpha_{RE}$ are parameters related to diffusion coefficients of the ammonium ions and the rare earth ions in the diffusion layer, respectively; $M_{NH_4}$ and $M_{RE}$ are the molar masses of the ammonium ions and the rare earth ions, respectively;

the ion exchange reaction between the ammonium ions and the rare earth ions adsorbed on the surfaces of the rare earth ore sample particles is described by a relational expression (4):

$$K = \frac{(C_s^{NH_4})^3 C_{in}^{RE}}{(C_{in}^{NH_4})^3 C_s^{RE}}, \quad (4)$$

in the relational expression (4), K is the ion exchange selection coefficient; $C_{in}^{NH_4}$ and $C_{in}^{RE}$ are the concentrations of the liquid phase ammonium ions and the liquid phase rare earth ions near the surfaces of the rare earth ore sample particles, respectively; $C_s^{NH_4}$ and $C_s^{RE}$ are the concentrations of the ammonium ions and the rare earth ions which are adsorbed on the surfaces of the rare earth ore sample particles;

in the leaching process, a system composed of the rare earth ore sample particles, the diffusion layer and the external solution is taken as a research object, and in the whole system, the ammonium ions and the rare earth ions should satisfy mass conservation and are respectively described by a relational expression (5) and a relationship expression (6):

$$m_s C_s^{RE} + C_{lq}^{RE} V_L = m_s C_{s0}^{RE} + C_{lq0}^{RE} V_L \quad (5),$$

$$m_s C_s^{NH_4} + C_{lq}^{NH_4} V_L = C_{lq0}^{NH_4} V_L + m_s C_{s0}^{NH_4} \quad (6),$$

in the relational expression (5) and the relationship expression (6), $m_s$ is the mass of the rare earth ore sample; $V_L$ is the volume of the external solution; $C_s^{NH_4}$ and $C_s^{RE}$ are the concentrations of the ammonium ions and the rare earth ions which are adsorbed on the surfaces of the rare earth ore sample particles; $C_{lq}^{NH_4}$ and $C_{lq}^{RE}$ are the concentrations of the ammonium ions and the rare earth ions in the external solution, respectively; $C_{s0}^{NH_4}$ and $C_{s0}^{RE}$ are the concentrations of the ammonium ions and the rare earth ions which are adsorbed on the surfaces of the rare earth ore particles before the ore leaching, respectively; $C_{lq0}^{NH_4}$ and $C_{lq0}^{RE}$ are the concentrations of the ammonium ions and the rare earth ions in the external solution before the ore leaching, respectively;

the rare earth ore sample particles are taken as the research object; before and after the ore leaching, if the quantity of adsorption sites on the surfaces of the rare earth ore sample particles does not change, the ammonium ions and the rare earth ions which are adsorbed on the surfaces of the rare earth ore particles before and after the ore leaching should satisfy a relational expression (7):

$$\frac{3C_s^{RE}}{M_{RE}} + \frac{C_s^{NH_4}}{M_{NH_4}} = \frac{3C_{s0}^{RE}}{M_{RE}} + \frac{C_{s0}^{NH_4}}{M_{NH_4}}, \quad (7)$$

in the relational expression (7), $M_{NH_4}$ and $M_{RE}$ are the molar masses of the ammonium ions and the rare earth ions; $C_s^{NH_4}$ and $C_s^{RE}$ are the concentrations of the ammonium ions and the rare earth ions which are adsorbed on the surfaces of the rare earth ore sample particles, respectively; $C_{s0}^{NH_4}$ and $C_{s0}^{RE}$ are the concentrations of the ammonium ions and the rare earth ions which are adsorbed on the surfaces of the rare earth ore particles before the ore leaching, respectively;

the relational expression (2), the relational expression (3) and the relational expressions (5) to (7) are substituted into the relational expression (4) to obtain a relational expression (8):

$$K = \frac{\left(\frac{M_{RE}}{3M_{NH_4}}C_{s0}^{NH_4} - \frac{V_L}{m_s}C_{lq0}^{RE} + \frac{V_L}{m_s}C_{lq}^{RE}\right)^3 \left(C_{lq}^{RE} - \alpha_{RE}\frac{dC_s^{RE}}{dt}\right)}{\left(\frac{M_{RE}}{3M_{NH_4}}C_{s0}^{NH_4} + C_{lq0}^{RE} - C_{lq}^{RE} + \alpha_{NH_4}\frac{dC_s^{RE}}{dt}\right)^3} \tag{8}$$

$$\left(C_{s0}^{RE} + \frac{V_L}{m_s}C_{lq0}^{RE} - \frac{V_L}{m_s}C_{lq}^{RE}\right)$$

in the relational expression (8), K is the ion exchange selection coefficient; $M_{NH_4}$ and $M_{RE}$ are the molar masses of the ammonium ions and the rare earth ions, respectively; $C_{s0}^{NH_4}$ and $C_{s0}^{RE}$ are the concentrations of the ammonium ions and the rare earth ions which are adsorbed on the surfaces of the rare earth ore particles before the ore leaching, respectively; $C_{lq0}^{NH_4}$ and $C_{lq0}^{RE}$ are the concentrations of the ammonium ions and the rare earth ions in the external solution before the ore leaching, respectively; $C_{lq}^{RE}$ is the concentration of the rare earth ions in the external solution; $C_s^{RE}$ is the concentration of the rare earth ions adsorbed on the surfaces of the rare earth ore sample particles; $\alpha_{NH_4}$ and $\alpha_{RE}$ are parameters related to diffusion coefficients of the ammonium ions and the rare earth ions in the diffusion layer, respectively; t is the time; d is the derivative symbol; $m_s$ is the mass of the rare earth ore sample; $V_L$ is the volume of the external solution;

in the relational expression (8), $dC_s^{RE}/dt$ is the rate of change over time of the concentration of the rare earth ions adsorbed on the surfaces of the rare earth ore particles, namely the source sink term of the leaching process. $dC_s^{RE}/dt$ is taken as a basic unknown, and the relational expression (8) is a one-unknown cubic equation with respect to $dC_s^{RE}/dt$, and the existing method is used to solve the relational expression (8) to obtain the source sink term of the ionic type rare earth ore leaching process; a result is expressed by a relational expression (9); and parameters in the relational expression (9) can be determined by a relational expression (10) to a relational expression (15):

$$\frac{dC_s^{RE}}{dt} = \sqrt[3]{-\frac{q}{2} + \sqrt{\left(\frac{q}{2}\right)^2 + \left(\frac{p}{3}\right)^3}} - \sqrt[3]{\frac{q}{2} + \sqrt{\left(\frac{q}{2}\right)^2 + \left(\frac{p}{3}\right)^3}} - \frac{b}{3a}, \tag{9}$$

$$p = \frac{3ac - b^2}{3a^2}, \tag{10}$$

$$q = \frac{27a^2 e - 9abc + 2b^3}{27a^3}, \tag{11}$$

$$a = \alpha_{NH_4}^3, \tag{12}$$

$$b = 3\alpha_{NH_4}^2 \left(\frac{M_{RE}}{3M_{NH_4}}C_{lq0}^{NH_4} + C_{lq0}^{RE} - C_{lq}^{RE}\right), \tag{13}$$

$$c = 3\alpha_{NH_4} \left(\frac{M_{RE}}{3M_{NH_4}}C_{lq0}^{NH_4} + C_{lq0}^{RE} - C_{lq}^{RE}\right)^2 + \tag{14}$$

$$\frac{\left(\frac{M_{RE}}{3M_{NH_4}}C_{s0}^{NH_4} - \frac{V_L}{m_s}C_{lq0}^{RE} + \frac{V_L}{m_s}C_{lq}^{RE}\right)^3}{K\left(C_{s0}^{RE} + \frac{V_L}{m_s}C_{lq0}^{RE} - \frac{V_L}{m_s}C_{lq}^{RE}\right)} \alpha_{RE},$$

$$e = \left(\frac{M_{RE}}{3M_{NH_4}}C_{lq0}^{NH_4} + C_{lq0}^{RE} - C_{lq}^{RE}\right)^3 - \tag{15}$$

$$\frac{\left(\frac{M_{RE}}{3M_{NH_4}}C_{s0}^{NH_4} - \frac{V_L}{m_s}C_{lq0}^{RE} + \frac{V_L}{m_s}C_{lq}^{RE}\right)^3}{K\left(C_{s0}^{RE} + \frac{V_L}{m_s}C_{lq0}^{RE} - \frac{V_L}{m_s}C_{lq}^{RE}\right)} C_{lq}^{RE},$$

in the relational expression (9) to the relational expression (15), p, q, a, b, c and e are temporary parameters of a calculation process; C is the concentration of the rare earth ions adsorbed on the surfaces of the rare earth ore sample particles; $M_{NH_4}$ and $M_{RE}$ are the molar masses of the ammonium ions and the rare earth ions, respectively; $\alpha_{NH_4}$ and $\alpha_{RE}$ are parameters related to diffusion coefficients of the ammonium ions and the rare earth ions in the diffusion layer, respectively; $C_{lq0}^{NH_4}$ and $C_{lq0}^{RE}$ are the concentrations of the ammonium ions and the rare earth ions in the external solution before the ore leaching, respectively; $C_{lq}^{RE}$ is the concentration of the rare earth ions in the external solution; $C_{s0}^{NH_4}$ and $C_{s0}^{RE}$ are the concentrations of the ammonium ions and the rare earth ions which are adsorbed on the surfaces of the rare earth ore particles before the ore leaching; K is the ion exchange selection coefficient; t is the time; d is the derivative symbol; $m_s$ is the mass of the rare earth ore sample; $V_L$ is the volume of the external solution;

Step four: determining parameters in the source sink term model:

performing a leaching kinetics test on the rare earth ore sample to test the concentrations of the rare earth ions in the leachate at different reaction time, determining a generating rate of the rare earth ions in the external solution, and obtaining test data of the rate of change over time of the concentration of the rare earth ions adsorbed on the surfaces of the rare earth ore sample particles through a relational expression (16):

$$\frac{dC_s^{RE}}{dt} = -\frac{V_L}{m_s}\frac{dC_{lq}^{RE}}{dt}, \tag{16}$$

in the relational expression (16), $C_s^{RE}$ is the concentration of the rare earth ions adsorbed on the surfaces of the rare earth ore sample particles; $C_{lq}^{RE}$ is the concentration of the rare earth ions in the external solution; t is the time; d is the derivative symbol; $m_s$ is the mass of the rare earth ore sample; $V_L$ is the volume of the external solution;

$\alpha_{NH_4}$ and $\alpha_{RE}$ are taken as basic unknowns, and the test data of the rate of change over time of the concentration of the rare earth ions adsorbed on the surfaces of the rare earth ore sample particles is fitted by using the relational expression (9) in the source sink term model built in the third step, thus finally determining the parameters $\alpha_{NH_4}$ and $\alpha_{RE}$ in the source sink term of the rare earth ore leaching process.

The present disclosure comprehensively considers a physical process for leaching the ionic type rare earth ores based on the Fick law and the ion exchange model, provides a test method for the parameters in the source sink term, and determines the topography, the water motion parameters, the solute transportation parameters, the distribution information of the rare earth grade of an actual mine through the prospecting data. The actual mine is subjected to grid division by a numerical method. The water motion parameters, the solute transportation parameters and the distribution information of the rare earth grade are assigned to respective grid nodes by a statistic finite element method. The source sink term provided by the present disclosure can simulate the ionic type rare earth ore leaching process on the basis of fully considering the complex geological conditions of the actual mine and non-uniform distribution of the rare earth grade by combining the solute transportation model, and determine the optimal concentration of the ore leaching agent (the ammonium sulfate solution) by combining an optimal algorithm. It can be seen from the implementation results that when the ammonium sulfate solution at the optimal concentration of 12.0 g/L is used to perform the column leaching test, the obtained rare earth leaching rate is up to 96.3 percent.

DETAILED DESCRIPTION OF THE EMBODIMENTS

The present disclosure is applied in a laboratory for a column leaching test. By taking ammonium sulfate as an ore leaching agent, an ion exchange selection coefficient and the grade of a rare earth ore sample are determined at first through a balance tube leaching test. A mathematical model of a leaching process is built according to a physical process of an ionic type rare earth ore leaching process. Parameters in the model are determined through a leaching dynamic test. A specific implementation solution is as follows.

Step one: the ion exchange selection coefficient of the rare earth ore sample is determined:

by taking the ammonium sulfate as the ore leaching agent, 10 parts of the rare earth ore sample, each part including 20.0 g, are selected; ore leaching is performed by using an ammonium sulfate solution at concentrations of 1.0 g/L, 1.5 g/L, 2.0 g/L, 3.0 g/L, 5.0 g/L, 7.0 g/L, 10.0 g/L, 13.0 g/L, 16.0 g/L and 20.0 g/L respectively according to a liquid-to-solid ratio of 5:1 mL/g; oscillation is performed at first for 2.0 h, and then the solution is stewed for 0.5 h; solid-liquid separation is performed by using medium speed filter paper; the concentration of the rare earth ions in leachate is tested by EDTA titrimetry, and a relationship curve of the concentration of the ore leaching agent solution and the concentration of the rare earth ions in the leachate is obtained; the ion exchange selection coefficient is taken as a basic unknown, and the ion exchange selection coefficient of the rare earth ore sample is determined as $12.59 \times 10^{-10}$ $L^2/g^2$ by fitting the relationship curve of the concentration of the ore leaching agent solution and the concentration of the rare earth ions in the leachate via an ion exchange model.

Step two: the rare earth grade of the rare earth ore sample is determined:

by taking the ammonium sulfate as the ore leaching agent, 20.0 g of the rare earth ore sample is selected; the ore leaching is performed by using an ammonium sulfate solution at concentration of 20.0 g/L according to the liquid-to-solid ratio of 5:1 mL/g; oscillation is performed at first for 2.0 h, and then the solution is stewed for 0.5 h; the solid-liquid separation is performed by using the medium speed filter paper; tailings are rinsed by using 100 mL of the ammonium sulfate solution at the concentration of 20 g/L; the total mass of leached rare earth ions is tested by the EDTA titrimetry, and the grade of the rare earth ore sample is calculated as 1.01‰ by a relational expression (1):

the relational expression (1):

$$\eta = \frac{m_{RE} M_{REO}}{m_s M_{RE}}. \tag{1}$$

In the relational expression (1), $\eta$ is the rare earth grade; $m_{RE}$ is the total mass of the leached rare earth ions; $m_s$ is the mass of the rare earth ore sample; and $M_{REO}$ and $M_{RE}$ are respectively the molar masses of a rare earth oxide and the rare earth ions.

Step three: a source sink term model of the ore leaching process is built.

The rare earth leaching of the ionic type rare earth ore sample includes three processes: (1) ammonium ions reach the surfaces of rare earth ore sample particles through a diffusion layer, (2) the ammonium ions and the rare earth ions adsorbed on the surfaces of the rare earth ore sample particles undergo ion exchange reaction, and (3) the desorbed rare earth ions get into an external solution through the diffusion layer.

The process that the ammonium ions and the rare earth ions pass through the diffusion layer is described by the Fick law, and the ammonium ions and the rare earth ions pass through the diffusion layer may be respectively calculated through a relational expression (2) and a relational expression (3):

the relational expression (2) and the relational expression (3):

$$-\frac{dN_{RE}}{dt} = \frac{1}{3} m_s \frac{C_{lq}^{NH_4} - C_{in}^{NH_4}}{\alpha_{NH_4} M_{NH_4}} \tag{2}$$

$$-\frac{dN_{RE}}{dt} = m_s \frac{C_{in}^{RE} - C_{lq}^{RE}}{\alpha_{RE} M_{RE}}. \tag{3}$$

In the relational expression (2) and the relational expression (3), $N_{RE}$ is the number of moles of the rare earth ions adsorbed on the surfaces of rare earth ore particles; t is time; d is a derivative symbol; in, is the mass of the rare earth ore sample; and $C_{lq}^{NH_4}$ and $C_{lq}^{RE}$ are the concentrations of the ammonium ions and the rare earth ions in the external solution, respectively; $C_{in}^{NH_4}$ and $C_{in}^{RE}$ are the concentrations of the liquid phase ammonium ions and the liquid phase rare earth ions near the surfaces of the rare earth ore sample particles, respectively; $\alpha_{NH_4}$ and $\alpha_{RE}$ are parameters related to diffusion coefficients of the ammonium ions and the rare earth ions in the diffusion layer, respectively; $M_{NH_4}$ and $M_{RE}$ are the molar masses of the ammonium ions and the rare earth ions, respectively.

The ion exchange reaction between the ammonium ions and the rare earth ions adsorbed on the surfaces of the rare earth ore sample particles is described by a relational expression (4):

the relational expression (4):

$$K = \frac{\left(C_s^{NH_4}\right)^3 C_{in}^{RE}}{\left(C_{in}^{NH_4}\right)^3 C_s^{RE}}. \tag{4}$$

In the relational expression (4), K is the ion exchange selection coefficient; $C_{in}^{NH_4}$ and $C_{in}^{RE}$ are the concentrations of the liquid phase ammonium ions and the liquid phase rare earth ions near the surfaces of the rare earth ore sample particles, respectively; $C_s^{NH_4 \text{ and } C_s^{RE}}$ are the concentrations of the ammonium ions and the rare earth ions which are adsorbed on the surfaces of the rare earth ore sample particles, respectively.

In the leaching process, a system composed of the rare earth ore sample particles, the diffusion layer and the external solution is taken as a research object, and in the whole system, the ammonium ions and the rare earth ions should satisfy mass conservation and are respectively described by a relational expression (5) and a relationship expression (6):

the relational expression (5) and the relational expression (6):

$$m_s C_s^{RE} + C_{lq}^{RE} V_L = m_s C_{s0}^{RE} + C_{lq0}^{RE} V_L \qquad (5),$$

$$m_s C_s^{NH_4} + C_{lq}^{NH_4} V_L = C_{lq0}^{NH_4} V_L + m_s C_{s0}^{NH_4} \qquad (6).$$

In the relational expression (5) and the relationship expression (6), $m_s$ is the mass of the rare earth ore sample; $V_L$ is the volume of the external solution; $C_s^{NH_4 \text{ and } C_s^{RE}}$ are the concentrations of the ammonium ions and the rare earth ions which are adsorbed on the surfaces of the rare earth ore sample particles, respectively; $C_{lq}^{NH_4}$ and $C_{lq}^{RE}$ are the concentrations of the ammonium ions and the rare earth ions in the external solution, respectively; $C_{s0}^{NH_4}$ and $C_{s0}^{RE}$ are the concentrations of the ammonium ions and the rare earth ions which are adsorbed on the surfaces of the rare earth ore sample particles before the ore leaching, respectively; $C_{lq0}^{NH_4}$ and $C_{lq0}^{RE}$ are the concentrations of the ammonium ions and the rare earth ions in the external solution before the ore leaching, respectively.

The rare earth ore sample particles are taken as the research object; before and after the ore leaching, if the quantity of adsorption sites on the surfaces of the rare earth ore sample particles does not change, the ammonium ions and the rare earth ions which are adsorbed on the surfaces of the rare earth ore particles before and after the ore leaching should satisfy a relational expression (7):

the relational expression (7):

$$\frac{3 C_s^{RE}}{M_{RE}} + \frac{C_s^{NH_4}}{M_{NH_4}} = \frac{3 C_{s0}^{RE}}{M_{RE}} + \frac{C_{s0}^{NH_4}}{M_{NH_4}}. \qquad (7)$$

In the relational expression (7), $M_{NH_4}$ and $M_{RE}$ are the molar masses of the ammonium ions and the rare earth ions, respectively; $C_s^{NH_4}$ and $C_s^{RE}$ are the concentrations of the ammonium ions and the rare earth ions which are adsorbed on the surfaces of the rare earth ore sample particles, respectively; $C_{s0}^{NH_4}$ and $C_{s0}^{RE}$ are the concentrations of the ammonium ions and the rare earth ions which are adsorbed on the surfaces of the rare earth ore particles before the ore leaching, respectively.

The relational expression (2), the relational expression (3) and the relational expressions (5) to (7) are substituted into the relational expression (4) to obtain a relational expression (8):

$$K = \frac{\left(\frac{M_{RE}}{3 M_{NH_4}} C_{s0}^{NH_4} - \frac{V_L}{m_s} C_{lq0}^{RE} + \frac{V_L}{m_s} C_{lq}^{RE}\right)^3 \left(C_s^{RE} - \alpha_{RE} \frac{dC_s^{RE}}{dt}\right)}{\left(\frac{M_{RE}}{3 M_{NH_4}} C_{lq0}^{NH_4} + C_{lq0}^{RE} - C_{lq}^{RE} + \alpha_{NH_4} \frac{dC_s^{RE}}{dt}\right)^3} \qquad (8)$$

$$\left(C_{s0}^{RE} + \frac{V_L}{m_s} C_{lq0}^{RE} - \frac{V_L}{m_s} C_{lq}^{RE}\right)$$

In the relational expression (8), K is the ion exchange selection coefficient; $M_{NH_4}$ and $M_{RE}$ are the molar masses of the ammonium ions and the rare earth ions, respectively; $C_{s0}^{NH_4}$ and $C_{s0}^{RE}$ are the concentrations of the ammonium ions and the rare earth ions which are adsorbed on the surfaces of the rare earth ore particles before the ore leaching, respectively; $C_{lq0}^{NH_4}$ and $C_{lq0}^{RE}$ are the concentrations of the ammonium ions and the rare earth ions in the external solution before the ore leaching, respectively; $C_{lq}^{RE}$ is the concentration of the rare earth ions in the external solution; $C_s^{RE}$ is the concentration of the rare earth ions adsorbed on the surfaces of the rare earth ore sample particles; $\alpha_{NH_4}$ and $\alpha_{RE}$ are parameters related to diffusion coefficients of the ammonium ions and the rare earth ions in the diffusion layer, respectively; t is the time; d is the derivative symbol; $m_s$ is the mass of the rare earth ore sample; $V_L$ is the volume of the external solution.

In the relational expression (8), $dC_s^{RE}/dt$ is the rate of change over time of the concentration of the rare earth ions adsorbed on the surfaces of the rare earth ore particles, namely the source sink term of the leaching process. $dC_s^{RE}/dt$ is taken as a basic unknown, and the relational expression (8) is a one-unknown cubic equation with respect to $dC_s^{RE}/dt$, and the relational expression (8) is solved by the Cardano's formula to obtain the source sink term of the ionic type rare earth ore leaching process; a result is expressed by a relational expression (9); and parameters in the relational expression (9) can be determined by a relational expression (10) to a relational expression (15):

the relational expression (9) to the relational expression (15):

$$\frac{dC_s^{RE}}{dt} = \sqrt[3]{-\frac{q}{2} + \sqrt{\left(\frac{q}{2}\right)^2 + \left(\frac{p}{3}\right)^3}} - \sqrt[3]{\frac{q}{2} + \sqrt{\left(\frac{q}{2}\right)^2 + \left(\frac{p}{3}\right)^3}} - \frac{b}{3a}, \qquad (9)$$

$$p = \frac{3ac - b^2}{3a^2}, \qquad (10)$$

$$q = \frac{27 a^2 e - 9abc + 2b^3}{27 a^3}, \qquad (11)$$

$$a = \alpha_{NH_4}^3, \qquad (12)$$

$$b = 3 \alpha_{NH_4}^2 \left(\frac{M_{RE}}{3 M_{NH_4}} C_{lq0}^{NH_4} + C_{lq0}^{RE} - C_{lq}^{RE}\right), \qquad (13)$$

$$c = 3 \alpha_{NH_4} \left(\frac{M_{RE}}{3 M_{NH_4}} C_{lq0}^{NH_4} + C_{lq0}^{RE} - C_{lq}^{RE}\right)^2 + \qquad (14)$$

$$\frac{\left(\frac{M_{RE}}{3 M_{NH_4}} C_{s0}^{NH_4} - \frac{V_L}{m_s} C_{lq0}^{RE} + \frac{V_L}{m_s} C_{lq}^{RE}\right)^3}{K \left(C_{s0}^{RE} + \frac{V_L}{m_s} C_{lq0}^{RE} - \frac{V_L}{m_s} C_{lq}^{RE}\right)} \alpha_{RE},$$

-continued $$e = \left(\frac{M_{RE}}{3M_{NH_4}} C_{lq0}^{NH_4} + C_{lq0}^{RE} - C_{lq}^{RE}\right)^3 - \qquad (15)$$

$$\frac{\left(\frac{M_{RE}}{3M_{NH_4}} C_{s0}^{NH_4} - \frac{V_L}{m_s} C_{lq0}^{RE} + \frac{V_L}{m_s} C_{lq}^{RE}\right)^3}{K\left(C_{s0}^{RE} + \frac{V_L}{m_s} C_{lq0}^{RE} - \frac{V_L}{m_s} C_{lq}^{RE}\right)} C_{lq}^{RE}.$$

In the relational expression (9) to the relational expression (15), p, q, a, b, c and e are temporary parameters of a calculation process; $C_s^{RE}$ is the concentration of the rare earth ions adsorbed on the surfaces of the rare earth ore sample particles; $M_{NH_4}$ and $M_{RE}$ are the molar masses of the ammonium ions and the rare earth ions, respectively; $\alpha_{NH_4}$ and $\alpha_{RE}$ are parameters related to diffusion coefficients of the ammonium ions and the rare earth ions in the diffusion layer, respectively; $C_{lq0}^{NH_4}$ and $C_{lq0}^{RE}$ are the concentrations of the ammonium ions and the rare earth ions in the external solution before the ore leaching, respectively; $C_{lq}^{RE}$ is the concentration of the rare earth ions in the external solution; $C_{s0}^{NH_4}$ and $C_{s0}^{RE}$ are the concentrations of the ammonium ions and the rare earth ions which are adsorbed on the surfaces of the rare earth ore particles before the ore leaching, respectively; K is the ion exchange selection coefficient; t is the time; d is the derivative symbol; $m_s$ is the mass of the rare earth ore sample; TA is the volume of the external solution;

Step four: parameters in the source sink term model are determined:

20.0 g of a polymerized rare earth ore sample is put into a centrifuge bottle with the volume of 250 mL; the centrifuge bottle is placed on a magnetic stirrer, and 100 mL of the ammonium sulfate solution at the concentration of 20.0 g/L is poured into the centrifuge bottle; the magnetic stirrer is turned on at the same time at a rotating speed of 1000 r/min; timing is started; at predetermined reaction time: 0 s, 5 s, 10 s, 15 s, 20 s, 30 s, 60 s, 90 s and 150 s, a centrifuge box is quickly centrifuged in a centrifuge with the set rotating speed being 3000 r/min and the set centrifuge time being 20 s; after the centrifuging is ended, the concentrations of the rare earth ions in the leachate at different reaction time are tested by the EDTA titrimetry; the generating rate of the rare earth ions in the external solution is determined; test data of the rate of change over time of the concentration of the rare earth ions adsorbed on the surfaces of the rare earth ore sample particles is obtained through a relational expression (16):

The relational expression (16):

$$\frac{dC_s^{RE}}{dt} = -\frac{V_L}{m_s} \frac{dC_{lq}^{RE}}{dt}. \qquad (16)$$

In the relational expression (16), $C_s^{RE}$ is the concentration of the rare earth ions adsorbed on the surfaces of the rare earth ore sample particles; $C_{lq}^{RE}$, is the concentration of the rare earth ions in the external solution; t is the time; d is the derivative symbol; $m_s$ is the mass of the rare earth ore sample; $V_L$ is the volume of the external solution.

$\alpha_{NH_4}$ and $\alpha_{RE}$ are taken as basic unknowns, and the test data of the rate of change over time of the concentration of the rare earth ions adsorbed on the surfaces of the rare earth ore sample particles is fitted by using the relational expression (9) in the source sink term model built in the third step, thus finally determining the parameters $\alpha_{NH_4}$ and $\alpha_{RE}$ in the source sink term of the rare earth ore leaching process to be $3.7 \times 10^3$ s/L and $1.3 \times 10^3$ s/L.

Implementation Effect:

The ammonium sulfate used as the ore leaching agent is subjected to the column leaching test of a fixed head. The pore ratio of column leaching is set to be 1.0, and the height of the water head is set to 5.0 cm, and the column length is 1.0 m. The leachate is collected every 2.0 h by using an automatic liquid collector. The concentration of the rare earth ions in the leachate is tested by the EDTA titrimetry. After the concentration of the rare earth ions in the leachate is less than 0.01 g/L, the test is terminated, and a breakthrough curve of the rare earth ions is obtained. The source sink term is substituted into a convection-dispersion equation to simulate the ore leaching process of the ionic type rare earth ore sample. A correlation coefficient between the breakthrough curve and a test breakthrough curve is calculated to be 0.91. The concentration of the ammonium sulfate solution is changed. The determining method of the source sink term, provided by the present disclosure, and the convection-dispersion equation are used to calculate the rare earth leaching rates corresponding to the different concentrations of the ammonium sulfate solution. A target leaching rate is set to be 95.0 percent. When the calculated leaching rates are greater than the target leaching rate, the optimal concentration of the ammonium sulfate solution is determined to be 12.0 g/L. When the ammonium sulfate solution at the concentration of 12.0 g/L is used to perform the column leaching test, the rare earth leaching rate is obtained as 96.3 percent.

What is claimed is:

1. A method for determining a source sink term in an ionic type rare earth ore leaching process, comprising the following steps:

step one: determining a rare earth grade of a rare earth ore sample:

performing a balance tube leaching test for repeatedly leaching the ionic type rare earth ore sample by an ore leaching agent, testing a total mass of leached rare earth ions, and calculating the rare earth grade η of the rare earth ore sample by a relational expression (1):

$$\eta = \frac{m_{RE} M_{REO}}{m_s M_{RE}}, \qquad (1)$$

wherein in the relational expression (1), η is the rare earth grade; $m_{RE}$ is the total mass of the leached rare earth ions; $m_s$ is a mass of the rare earth ore sample; and $M_{REO}$ and $M_{RE}$ are respectively molar masses of a rare earth oxide and the rare earth ions;

step two: determining an ion exchange selection coefficient K of the rare earth ore sample:

performing a balance tube leaching test for leaching the ionic type rare earth ore sample by the ore leaching agent at a concentration of 1.0 to 20.0 g/L, testing a concentration of the rare earth ions in leachate to obtain a relationship curve of a concentration of an ore leaching agent solution and the concentration of the rare earth ions in the leachate, taking the ion exchange selection coefficient as a basic unknown, fitting the relationship curve of the concentration of the ore leaching agent and the concentration of the rare earth ions in the leachate with an ion exchange model, and determining the ion exchange selection coefficient of the rare earth ore sample;

step three: building a source sink term model of the ore leaching process:

setting $$a = \alpha_{NH_4}^3, \quad (12)$$

$$b = 3\alpha_{NH_4}^2\left(\frac{M_{RE}}{3M_{NH_4}}C_{lq0}^{NH_4} + C_{lq0}^{RE} - C_{lq}^{RE}\right), \quad (13)$$

$$c = 3\alpha_{NH_4}\left(\frac{M_{RE}}{3M_{NH_4}}C_{lq0}^{NH_4} + C_{lq0}^{RE} - C_{lq}^{RE}\right)^2 + \frac{\left(\frac{M_{RE}}{3M_{NH_4}}C_{s0}^{NH_4} - \frac{V_L}{m_s}C_{lq0}^{RE} + \frac{V_L}{m_s}C_{lq}^{RE}\right)^3}{K\left(C_{s0}^{RE} + \frac{V_L}{m_s}C_{lq0}^{RE} - \frac{V_L}{m_s}C_{lq}^{RE}\right)}\alpha_{RE}, \quad (14)$$

$$e = \left(\frac{M_{RE}}{3M_{NH_4}}C_{lq0}^{NH_4} + C_{lq0}^{RE} - C_{lq}^{RE}\right)^3 - \frac{\left(\frac{M_{RE}}{3M_{NH_4}}C_{s0}^{NH_4} - \frac{V_L}{m_s}C_{lq0}^{RE} + \frac{V_L}{m_s}C_{lq}^{RE}\right)^3}{K\left(C_{s0}^{RE} + \frac{V_L}{m_s}C_{lq0}^{RE} - \frac{V_L}{m_s}C_{lq}^{RE}\right)}C_{lq}^{RE}, \quad (15)$$

wherein a, b, c and e are all temporary variables; $\alpha_{NH_4}$ and $\alpha_{RE}$ are parameters related to diffusion coefficients of ammonium ions and the rare earth ions in a diffusion layer, respectively; $M_{NH_4}$ is a molar mass of the ammonium ions; $C_{lq0}^{NH_4}$ and $C_{lq0}^{RE}$ are concentrations of cations and the rare earth ions in the added ore leaching agent, respectively; $C_{lq}^{RE}$ is the concentration of the rare earth ions in the leachate after the ore leaching is balanced; $C_{s0}^{NH_4}$ and $C_{s0}^{RE}$ are concentrations of the ammonium ions and the rare earth ions which are adsorbed on the rare earth ore sample before the ore leaching, respectively, $C_{s0}^{RE}=\eta M_{RE}/M_{REO}$; K is the ion exchange selection coefficient; $V_L$ is a volume of the added ore leaching agent solution;

performing a leaching kinetics test on the rare earth ore sample to test the concentrations of the rare earth ions in the leachate at different reaction time, determining a generating rate of the rare earth ions in an external solution, and obtaining test data of the rate of change over time of the concentration of the rare earth ions adsorbed on the surfaces of rare earth ore sample particles through a relational expression (16):

$$\frac{dC_s^{RE}}{dt} = -\frac{V_L}{m_s}\frac{dC_{lq}^{RE}}{dt}, \quad (16)$$

wherein in the relational expression (16), $C_s^{RE}$ is the concentration of the rare earth ions adsorbed on the surfaces of the rare earth ore sample particles; $C_{lq}^{RE}$ is the concentration of the rare earth ions in the external solution; t is the time; d is the derivative symbol; $m_s$ is the mass of the rare earth ore sample; $V_L$ is the volume of the external solution;

the process that the ammonium ions and the rare earth ions pass through the diffusion layer is described by the Fick law; an ion exchange process is described by a mass-action model; in consideration of the non-shrinkage of the ore sample particles and the reversibility of ion exchange in the ore leaching process, the source sink term model of the ionic type rare earth ore leaching process is obtained, and a result is as shown in a relational expression (9):

$$\frac{dC_s^{RE}}{dt} = \sqrt[3]{-\frac{q}{2} + \sqrt{\left(\frac{q}{2}\right)^2 + \left(\frac{p}{3}\right)^3}} - \sqrt[3]{\frac{q}{2} + \sqrt{\left(\frac{q}{2}\right)^2 + \left(\frac{p}{3}\right)^3}} - \frac{b}{3a}, \quad (9)$$

wherein in the relational expression (9), t is the time; d is the derivative symbol; p and q are respectively calculated with a relational expression (10) and a relational expression (11):

$$p = \frac{3ac - b^2}{3a^2}, \quad (10)$$

$$q = \frac{27a^2e - 9abc + 2b^3}{27a^3}, \quad (11)$$

wherein $\alpha_{NH_4}$ and $\alpha_{RE}$ are taken as basic unknowns, and the test data of the rate of change over time of the concentration of the rare earth ions adsorbed on the rare earth ore sample is fitted with the relational expression (9), thus determining the parameters $\pi_{NH_4}$ and $\alpha_{RE}$ in the source sink term of the rare earth ore leaching process;

the determined parameters $a_{NH_4}$ and $\alpha_{RE}$ in the source sink term are substituted into the relational expression (9) to determine the source sink term of the rare earth ore sample.

2. The method for determining the source sink term in the ionic type rare earth ore leaching process according to claim 1, wherein the method of the step one comprises:
taking the ammonium sulfate as the ore leaching agent, selecting 20.0 g of the rare earth ore sample;
performing ore leaching with an ammonium sulfate solution at a concentration of 20.0 g/L according to a liquid-to-solid ratio of 5:1 mL/g;
oscillating the solution at first for 2.0 h, and then stewing the solution for 0.5 h;
performing solid-liquid separation on the solution with medium speed filter paper;
rinsing tailings with 100 mL of the ammonium sulfate solution at the concentration of 20 g/L;
testing the total mass of the leached rare earth ions by EDTA titrimetry; and
calculating the rare earth grade of the rare earth ore sample with the relational expression (1).

3. The method for determining the source sink term in the ionic type rare earth ore leaching process according to claim 1, wherein the method of the step two comprises:
taking the ammonium sulfate as the ore leaching agent, selecting 10 parts of the rare earth ore sample, each part comprising 20.0 g;
performing ore leaching with an ammonium sulfate solution according to a liquid-to-solid ratio of 5:1 mL/g, wherein the concentrations of the ammonium sulfate solution are 1.0 g/L, 1.5 g/L, 2.0 g/L, 3.0 g/L, 5.0 g/L, 7.0 g/L, 10.0 g/L, 13.0 g/L, 16.0 g/L and 20.0 g/L respectively;
oscillating the solution at first for 2.0 h, and then stewing the solution for 0.5 h;

performing solid-liquid separation on the solution with medium speed filter paper;

testing the concentration of the rare earth ions in the leachate by EDTA titrimetry to obtain the relationship curve of the concentration of the ore leaching agent solution and the concentration of the rare earth ions in the leachate;

taking the ion exchange selection coefficient as a basic unknown;

fitting a relationship curve of the concentration of the ore leaching agent and the concentration of the rare earth ions in the leachate with the ion exchange model; and determining the ion exchange selection coefficient of the rare earth ore sample.

4. The method for determining the source sink term in the ionic type rare earth ore leaching process according to claim 1, wherein a determining method of the ion exchange selection coefficient K in the step two is that:

the ion exchange model is to describe the ion exchange process (a relational expression (4)) by a Kerr model;

a relational expression (5) to a relational expression (7) are substituted into the relational expression (4);

the ion exchange selection coefficient is taken as a basic unknown;

the relational expression (4) is used to fit the relationship curve of the concentration of the ore leaching agent and the concentration of the rare earth ions in the leachate to determine the ion exchange selection coefficient K of the rare earth ore sample;

$$K = \frac{(C_s^{NH_4})^3 C_{in}^{RE}}{(C_{in}^{NH_4})^3 C_s^{RE}}, \quad (4)$$

in a relational expression (2), $C_s^{RE}$, $C_{lq}^{NH_4}$ and $C_s^{NH_4}$ may be determined by using the relational expression (5) to the relational expression (7):

$$m_s C_s^{RE} + C_{lq}^{RE} V_L = m_s C_{s0}^{RE} + C_{lq0}^{RE} V_L, \quad (5)$$

$$m_s C_s^{NH_4} + C_{lq}^{NH_4} V_L = C_{lq0}^{NH_4} V_L + m_s C_{s0}^{NH_4}, \quad (6)$$

$$\frac{3C_s^{RE}}{M_{RE}} + \frac{C_s^{NH_4}}{M_{NH_4}} = \frac{3C_{s0}^{RE}}{M_{RE}} + \frac{C_{s0}^{NH_4}}{M_{NH_4}}, \quad (7)$$

in the relational expression (5) to the relational expression (7), $M_{NH_4}$ and $M_{RE}$ are the molar masses of the ammonium ions and the rare earth ions, respectively; $m_s$ is the mass of the rare earth ore sample; $V_L$ is the volume of the external solution; $C_s^{NH_4}$ and $C_s^{RE}$ are the concentrations of the ammonium ions and the rare earth ions which are adsorbed on the surfaces of the rare earth ore sample particles, respectively; $C_{lq}^{NH_4}$ and $C_{lq}^{RE}$ are the concentrations of the ammonium ions and the rare earth ions in the external solution, respectively; $C_{s0}^{NH_4}$ and $C_{s0}^{RE}$ are the concentrations of the ammonium ions and the rare earth ions which are adsorbed on the surfaces of the rare earth ore particles before the ore leaching, respectively; and $C_{lq0}^{NH_4}$ and $C_{lq0}^{RE}$ are the concentrations of the ammonium ions and the rare earth ions in the external solution before the ore leaching, respectively.

5. The method for determining the source sink term in the ionic type rare earth ore leaching process according to claim 1, wherein the method of the step three comprises:

putting 20.0 g of a polymerized rare earth ore sample into a centrifuge bottle with the volume of 250 mL;

placing the centrifuge bottle on a magnetic stirrer, and pouring 100 mL of the ammonium sulfate solution at the concentration of 20.0 g/L into the centrifuge bottle;

turning on the magnetic stirrer at the same time at a rotating speed of 1000 r/min;

starting timing, and at predetermined reaction time: 0 s, 5 s, 10 s, 15 s, 20 s, 30 s, 60 s, 90 s and 150 s, quickly centrifuging a centrifuge box in a centrifuge with the set rotating speed being 3000 r/min and the set centrifuge time being 20 s;

after the centrifuging is ended, testing the concentrations of the rare earth ions in the leachate at different reaction time by EDTA titrimetry;

determining the generating rate of the rare earth ions in the external solution;

obtaining test data of the rate of change over time of the concentration of the rare earth ions adsorbed on the surfaces of the rare earth ore sample particles through the relational expression (16);

taking $\alpha_{NH_4}$ and $\alpha_{RE}$ as basic unknowns, and determining the $\alpha_{NH_4}$ and $\alpha_{RE}$ through fitting the data, obtained by the relational expression (16), by the relational expression (9).

6. The method for determining the source sink term in the ionic type rare earth ore leaching process according to claim 1, wherein the method of building the source sink term model is that the rare earth leaching of the ionic type rare earth ore sample comprises three processes:

(1) ammonium ions reach the surfaces of rare earth ore sample particles through a diffusion layer, (2) the ammonium ions and the rare earth ions adsorbed on the surfaces of the rare earth ore sample particles undergo ion exchange reaction, and (3) the desorbed rare earth ions get into an external solution through the diffusion layer;

the process that the ammonium ions and the rare earth ions pass through the diffusion layer is described by the Fick law, and the ammonium ions and the rare earth ions pass through the diffusion layer may be respectively calculated through a relational expression (2) and a relational expression (3):

the relational expression (2) and the relational expression (3) are $$-\frac{dN_{RE}}{dt} = \frac{1}{3} m_s \frac{C_{lq}^{NH_4} - C_{in}^{NH_4}}{\alpha_{NH_4} M_{NH_4}} \quad (2)$$

$$-\frac{dN_{RE}}{dt} = m_s \frac{C_{in}^{RE} - C_{lq}^{RE}}{\alpha_{RE} M_{RE}}; \quad (3)$$

wherein in the relational expression (2) and the relational expression (3), $N_{RE}$ is the number of moles of the rare earth ions adsorbed on the surfaces of rare earth ore particles; t is time; d is a derivative symbol; $m_s$ is the mass of the rare earth ore sample; $C_{lq}^{NH_4}$ and $C_{lq}^{RE}$ are the concentrations of the ammonium ions and the rare earth ions in the external solution, respectively; $C_{in}^{NH_4}$ and $C_{in}^{RE}$ are the concentrations of the liquid phase ammonium ions and the liquid phase rare earth ions near the surfaces of the rare earth ore sample particles, respectively; $\alpha_{NH_4}$ and $\alpha_{RE}$ are parameters related to diffusion coefficients of the ammonium ions and the rare earth ions in the diffusion layer, respectively; $M_{NH_4}$ and $M_{RE}$ are the molar masses of the ammonium ions and the rare earth ions, respectively;

the ion exchange reaction between the ammonium ions and the rare earth ions adsorbed on the surfaces of the rare earth ore sample particles is described by a relational expression (4);

the relational expression (2), the relational expression (3) and the relational expressions (5) to (7) are substituted into the relational expression (4) to obtain a relational expression (8):

$$K = \frac{\left(\frac{M_{RE}}{3M_{NH_4}} C_{s0}^{NH_4} - \frac{V_L}{m_s} C_{lq0}^{RE} + \frac{V_L}{m_s} C_{lq}^{RE}\right)^3 \left(C_{lq}^{RE} - \alpha_{RE} \frac{dC_s^{RE}}{dt}\right)}{\left(\frac{M_{RE}}{3M_{NH_4}} C_{lq0}^{NH_4} + C_{lq0}^{RE} - C_{lq}^{RE} + \alpha_{NH_4} \frac{dC_s^{RE}}{dt}\right)^3} ,$$
$$\left(C_{s0}^{RE} + \frac{V_L}{m_s} C_{lq0}^{RE} - \frac{V_L}{m_s} C_{lq}^{RE}\right)$$

(8)

in the relational expression (8), K is the ion exchange selection coefficient; $M_{NH_4}$ and $M_{RE}$ are the molar masses of the ammonium ions and the rare earth ions, respectively; $C_{s0}^{NH_4}$ and $C_{s0}^{RE}$ are the concentrations of the ammonium ions and the rare earth ions which are adsorbed on the surfaces of the rare earth ore particles before the ore leaching, respectively; $C_{lq0}^{NH_4}$ and $C_{lq0}^{RE}$ are the concentrations of the ammonium ions and the rare earth ions in the external solution before the ore leaching, respectively; $C_{lq}^{RE}$ is the concentration of the rare earth ions in the external solution; $C_s^{RE}$ is the concentration of the rare earth ions adsorbed on the surfaces of the rare earth ore sample particles; $\alpha_{NH_4}$ and $\alpha_{RE}$ are parameters related to diffusion coefficients of the ammonium ions and the rare earth ions in the diffusion layer, respectively; t is the time; d is the derivative symbol; $m_s$ is the mass of the rare earth ore sample; $V_L$ is the volume of the external solution;

in the relational expression (8), $dC_s^{RE}/dt$ is the rate of change over time of the concentration of the rare earth ions adsorbed on the surfaces of the rare earth ore particles, namely the source sink term of the leaching process; $dC_s^{RE}/dt$ is taken as a basic unknown, and the relational expression (8) is a one-unknown cubic equation, and the relational expression (8) is solved by the Cardano's formula to obtain the source sink term of the ionic type rare earth ore leaching process; a result is expressed by a relational expression (9); and parameters in the relational expression (9) can be determined by a relational expression (10) to a relational expression (15).

* * * * *